United States Patent
Mochida

(10) Patent No.: US 12,073,868 B2
(45) Date of Patent: Aug. 27, 2024

(54) TIMING ADJUSTMENT FOR DATA INPUT/OUTPUT BUFFER CIRCUITS

(71) Applicant: Micron Technology, Inc., Boise, ID (US)

(72) Inventor: Noriaki Mochida, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 17/834,754

(22) Filed: Jun. 7, 2022

(65) Prior Publication Data

US 2023/0395124 A1 Dec. 7, 2023

(51) Int. Cl.
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
CPC ............ G11C 11/4076; G11C 11/4093; G11C 7/1066; G11C 29/022; G11C 29/023; G11C 29/028; G11C 29/50012; G11C 2207/2254
USPC .............................................. 365/149, 189.05
See application file for complete search history.

(56) References Cited

U.S. PATENT DOCUMENTS

| | | | |
|---|---|---|---|
| 5,648,972 A * | 7/1997 | Gharakhanian | G06F 13/4072 714/716 |
| 5,687,013 A * | 11/1997 | Henmi | H04Q 11/0062 398/1 |
| 6,008,680 A * | 12/1999 | Kyles | H03K 5/131 327/284 |
| 7,546,494 B2 * | 6/2009 | Haas | H04L 25/14 714/716 |
| 7,688,928 B2 * | 3/2010 | Lin | H03L 7/06 375/376 |
| 7,715,467 B1 * | 5/2010 | Burney | H04J 3/0685 375/219 |
| 9,325,553 B2 * | 4/2016 | Kaukovuori | H04J 11/0063 |
| 9,882,795 B1 * | 1/2018 | Zhang | H04L 7/033 |
| 10,153,922 B1 * | 12/2018 | Sreeramaneni | H04L 25/4917 |
| 10,236,891 B1 * | 3/2019 | Mehta | H03M 9/00 |
| 10,693,562 B2 * | 6/2020 | Yamamoto | H04B 10/54 |
| 11,356,304 B1 * | 6/2022 | Fortin | H04L 25/03949 |
| 11,777,770 B1 * | 10/2023 | Levy | H04L 25/03872 375/261 |
| 2003/0065859 A1 * | 4/2003 | Dao | H04L 7/0338 710/305 |

(Continued)

FOREIGN PATENT DOCUMENTS

| | | | | | |
|---|---|---|---|---|---|
| WO | WO-03053019 A2 * | 6/2003 | | | H04B 1/0003 |
| WO | WO-2008014599 A1 * | 2/2008 | | | H04L 1/243 |

*Primary Examiner* — Michael T Tran
(74) *Attorney, Agent, or Firm* — Dorsey & Whitney LLP

(57) ABSTRACT

Apparatuses including a loopback circuit are disclosed. An example apparatus according to the disclosure includes a plurality of input signal receivers and a loopback circuit coupled to the plurality of input signal receivers. The loopback circuit includes a signal multiplexer and a selector. The signal multiplexer provides an input signal received at one input receiver of the plurality of input receivers as a selected signal. The selector coupled to the signal multiplexer provides a loopback signal based on the selected signal and an alleviation signal that transitions between two different states, periodically.

21 Claims, 6 Drawing Sheets

(56) References Cited

U.S. PATENT DOCUMENTS

| | | | |
|---|---|---|---|
| 2003/0145259 A1* | 7/2003 | Kashiwakura | H04L 43/50 714/712 |
| 2004/0193975 A1* | 9/2004 | Tarango | H04L 1/243 714/724 |
| 2006/0093359 A1* | 5/2006 | Lee | H04J 14/025 398/71 |
| 2006/0245473 A1* | 11/2006 | Cheng | G06F 13/423 375/145 |
| 2007/0217559 A1* | 9/2007 | Stott | H04L 7/0008 375/355 |
| 2007/0258524 A1* | 11/2007 | Chen | H04L 27/2662 375/260 |
| 2010/0231409 A1* | 9/2010 | Okada | G06F 13/387 710/61 |
| 2011/0150477 A1* | 6/2011 | Winzer | H04J 14/06 398/79 |
| 2012/0054517 A1* | 3/2012 | Fuh | G06F 1/3287 713/320 |
| 2013/0129014 A1* | 5/2013 | Kim | H04L 1/0026 375/295 |
| 2013/0322512 A1* | 12/2013 | Francese | H04L 25/03146 375/233 |
| 2016/0100395 A1* | 4/2016 | Xu | H04L 1/1607 370/336 |
| 2016/0182182 A1* | 6/2016 | Schmogrow | H04B 10/6166 398/65 |
| 2017/0212619 A1* | 7/2017 | Sharma | G06F 3/0416 |
| 2018/0212681 A1* | 7/2018 | Tanaka | H04B 10/118 |
| 2018/0262293 A1* | 9/2018 | Ip | H04J 14/0295 |
| 2019/0052393 A1* | 2/2019 | Barnard | H04J 14/0201 |
| 2020/0007379 A1* | 1/2020 | Patil | H04L 27/06 |
| 2021/0083837 A1* | 3/2021 | Chen | H04L 7/0012 |

* cited by examiner

TIMING ADJUSTMENT FOR DATA INPUT/OUTPUT BUFFER CIRCUITS

BACKGROUND

High data reliability, high speed of memory access, reduced chip size and reduced power consumption are features that are demanded from semiconductor memory.

Recently, some semiconductor memory devices may include a loopback mechanism. Once a semiconductor memory device receives input signals from an external device, such as a memory controller or a test instrument, the loopback mechanism in the semiconductor memory device provides the received input signals back to a receiver of the external device on a loopback path. Thus, the external device may monitor the signals transmitted to the semiconductor memory device without writing data on the transmitted signals into memory in the semiconductor memory device and reading the data from the memory. That is, it is unnecessary to issue "write" and "read" command to the semiconductor memory device from the external device to monitor the data. Thus high data reliability under high-speed operations can be assured without extra procedures.

When signal transmissions on the loopback path become faster, the timing of signals become critical. Degradation of transistors on the loopback path may delay signals and cause critical failures. An example known cause for transistor degradation is bias temperature instability (BTI) in transistors while the transistors are kept in one state. Transistors in a loopback path may be kept in one state under BTI stress during an inactive state of signal transmissions, such as when the semiconductor memory device is either in an off-state or in a self-refresh mode. Because of BTI stress during the inactive state, gate delay times may be increased in the semiconductors. The loopback path including such semiconductors may result in violating time requirements for high-speed operations. Thus, countermeasures to mitigate BTI may be desired to improve reliability of signal transmissions in the loopback path.

DETAILED DESCRIPTION

Various embodiments of the disclosure will be explained below in detail with reference to the accompanying drawings. The following detailed description refers to the accompanying drawings that show, by way of illustration, specific aspects and details in which embodiments of the disclosure may be practiced. The detailed description includes sufficient detail to enable those skilled in the art to practice embodiments of the disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

To mitigate degradation of transistors on a loopback path due to the BTI stress, a signal that transitions between two different states may be provided to the loopback path while signal transmission is inactive.

Figure 1:
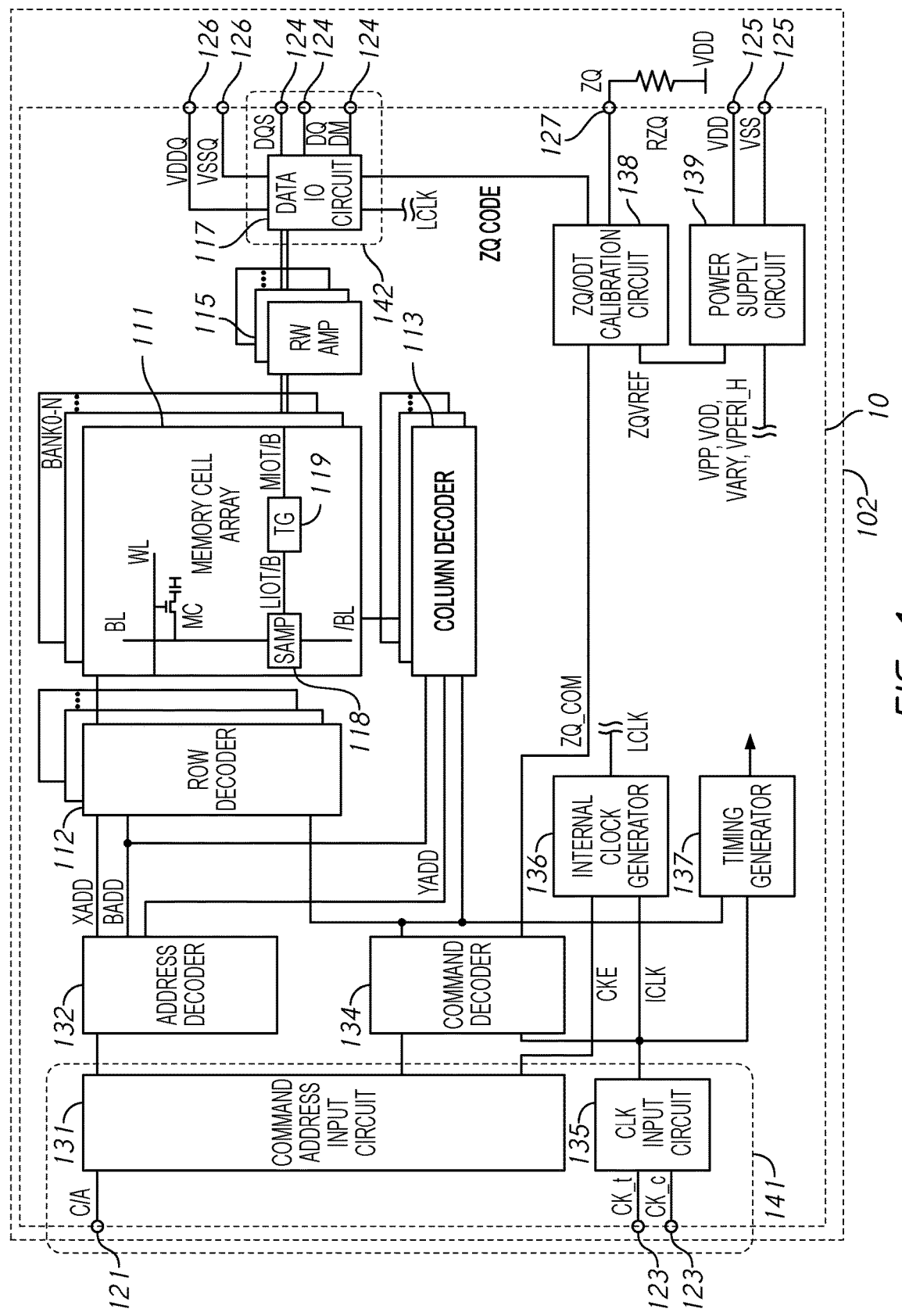
FIG. 1 is a block diagram of a semiconductor device in accordance with an embodiment of the present disclosure.

FIG. 1 is a block diagram of a semiconductor device 10 in accordance with one embodiment of the present disclosure. The semiconductor device 10 may be a dynamic random-access memory (DRAM), such as a double data rate SDRAM integrated into a single semiconductor chip, for example. The semiconductor device 10 may be mounted on an external substrate 102, for example, a memory module substrate, a mother board or the like.

As shown in FIG. 1, the semiconductor device 10 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 118 are coupled to corresponding bit lines BL and connected to local I/O line pairs LIOT/B. Local IO line pairs LIOT/B are connected to main IO line pairs MIOT/B via transfer gates TG 119 which function as selector circuits.

Turning to the explanation of a plurality of external terminals included in the semiconductor device 10, the plurality of external terminals includes command/address terminals 121, clock terminals 123, data terminals 124, power supply terminals 125 and 126, and a calibration terminal ZQ 127. An input signal block 141 may include the command/address terminals 121. The command/address terminals 121 and signal lines coupled to the command/address terminal 121 may include a first set of terminals and signal lines that are configured to receive the command signals and a separate, second set of terminals and signal lines that configured to receive the address signals, in some examples. In other examples, the terminals 121 and signal lines associated with command/address terminals 121 may include common terminals and signal lines that are configured to receive both command signal and address signals. The input signal block 141 may include the clock terminals 123 which include input buffers. A data interface block 142 includes the data terminals 124 that will be later described, according to one embodiment. The data terminals 124 may be coupled to output buffers for read operations of memories. Alternatively, the data terminals 124 may be coupled to input buffers for read/write access of the memories. FIG. 1 shows an example of dynamic random access memory (DRAM), however, any device having external terminals for signal input/output may be included as the external terminals of embodiments of the present disclosure. Each terminal of the plurality of external terminals may include a pad. A plurality of pads in the plurality of external terminals 124 will be explained below in detail.

The semiconductor device 10 includes a command/address input circuit 131. The command/address input circuit 131 may receive an address signal ADD and a bank address signal BADD from the command/address terminals 121, and transmit the address signal ADD and the bank address signal BADD to an address decoder 132. The address decoder 132 may decode the address signal ADD and provide a decoded row address signal XADD to the row decoder 112, and a decoded column address signal YADD to the column decoder 113. The address decoder 132 also may also receive the bank address signal BADD and provide the bank address signal BADD to the row decoder 112 and the column decoder 113.

The command/address input circuit 131 may receive a command signal from outside, such as, for example, a memory controller, at the command/address terminals 121. The command/address input circuit 131 may provide the command signal to the command decoder 134. The command decoder 134 may decode the command signal and generate various internal command signals. The internal command signals may be used to control operation and timing of various circuits of the semiconductor device 10. For example, the internal command signals may include a row command signal, such as an active command, to select a word line and a column command signal, such as a read command or a write command, to select a bit line, and a calibration signal ZQ_COM to a ZQ calibration circuit 138.

Accordingly, when an active command is issued with a row address and a column address is timely supplied with a read command, read data is read from a memory cell MC in the memory cell array 111 designated by these row address and column address. The read data DQ is output externally from the data terminals 124 via a read/write amplifier 115 and a data input/output circuit 117. When the write command is issued and a column address is timely supplied with this command, and then write data DQ is supplied to the data terminals 124 in synchronization with a data strobe signal DQS while a data mask signal DM allowing masking of invalid write data is not active. The write data DQ is supplied via the data input/output circuit 117 and the read/write amplifier 115 to the memory cell array 111 and written in the memory cell MC designated by the row address and the column address.

The clock terminals 123 are supplied with external clock signals CK_t and CK_c, respectively. These external clock signals CK_t and CK_c are complementary to each other and are supplied to a clock input circuit 135. The clock input circuit 135 receives the external clock signals CK_t and CK_c and generates an internal clock signal ICLK. The internal clock signal ICLK is supplied to an internal clock generator 136 and thus a phase controlled internal clock signal LCLK is generated based on the received internal clock signal ICLK and a clock enable signal CKE from the command/address input circuit 131. The phase controlled internal clock signal LCLK is supplied to the data input/output circuit 117 and is used as a timing signal for determining an output timing of the read data DQ. The internal clock signal ICLK is also supplied to a timing generator 137 and thus various internal clock signals can be generated.

The power supply terminals 125 are supplied with power supply potentials VDD and VSS. These power supply potentials VDD and VSS are supplied to an internal power supply circuit 139. The internal power supply circuit 139 generates various internal potentials, for example, VPP, VOD, VARY, VPERI, and a reference potential ZQVREF based on the power supply potentials VDD and VSS. The internal potential VPP is mainly used in the row decoder 112, the internal potentials VOD and VARY are mainly used in the sense amplifiers 118 included in the memory cell array 111, and the internal potential VPERI may be used in many other circuit blocks in a peripheral region outside the memory cell array 111. The reference potential ZQVREF is used in the ZQ calibration circuit 138.

The power supply terminals 126 are supplied with power supply potentials VDDQ and VSSQ. These power supply potentials VDDQ and VSSQ are supplied to the data input/output circuit 117. The power supply potentials VDDQ and VSSQ may be the same potentials as the power supply potentials VDD and VSS that are supplied to the power supply terminals 125, respectively. However, the power supply potentials VDDQ and VSSQ may be used for the data input/output circuit 117 so that power supply noise generated by the input/output circuit 117 does not propagate to the other circuit blocks.

The calibration terminal ZQ 127 is connected to the calibration circuit 138. The calibration terminal ZQ 127 is also connected to an external resistor $R_{ZQ}$ included in the external substrate 102. The ZQ calibration circuit 138 performs a calibration operation with reference to an impedance of the external resistance $R_{ZQ}$ and the reference potential ZQVREF. When the calibration circuit 138 is activated by the calibration signal ZQ_COM, an impedance code ZQCODE may be provided by the calibration operation. Thus impedances of input buffers and output buffers in the data input/output circuit 117 can be adjusted based on the power supply mode.

Figure 2:
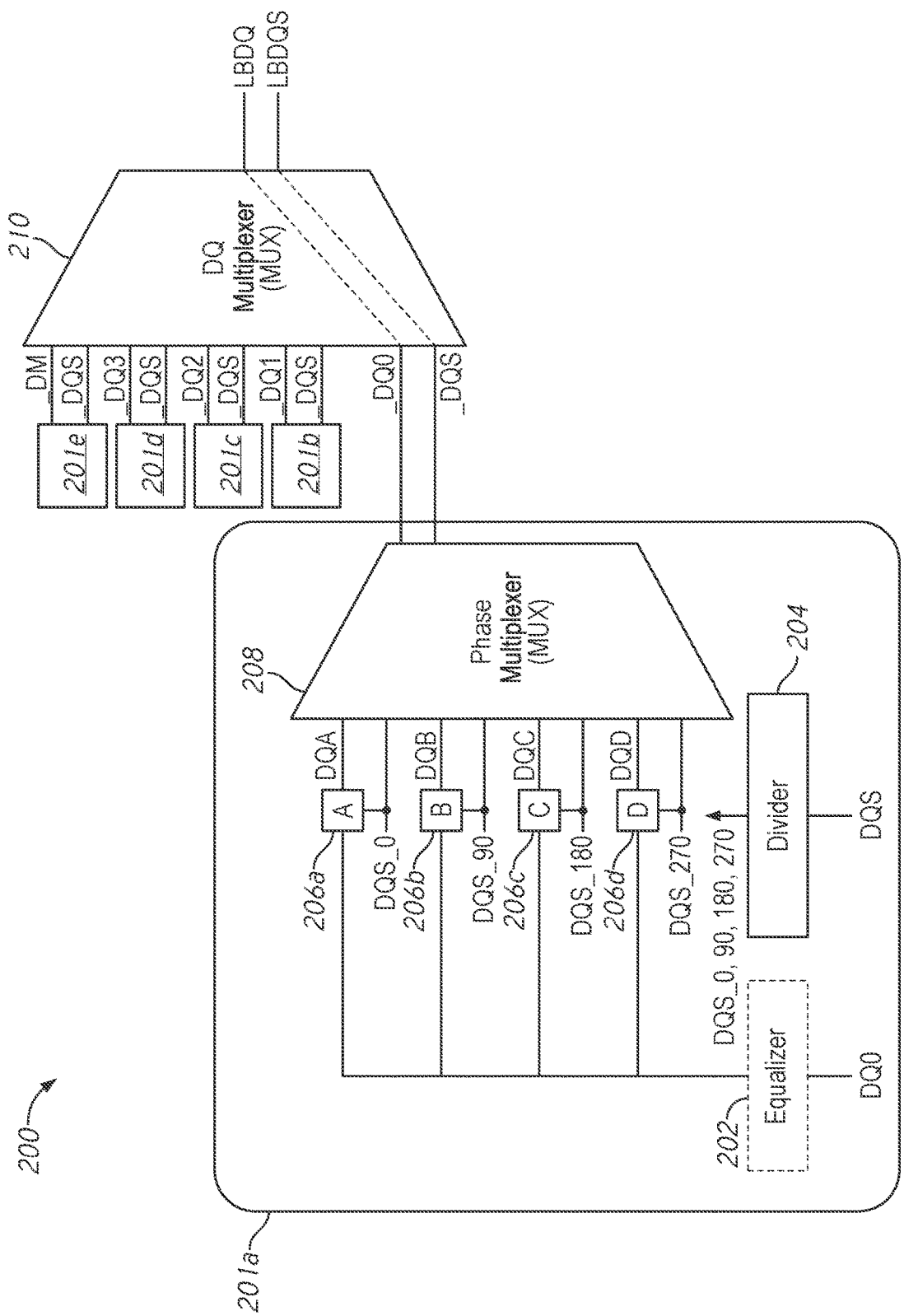
FIG. 2 is a schematic diagram of a loopback circuit in accordance with an embodiment of the present disclosure.
Figure 3:
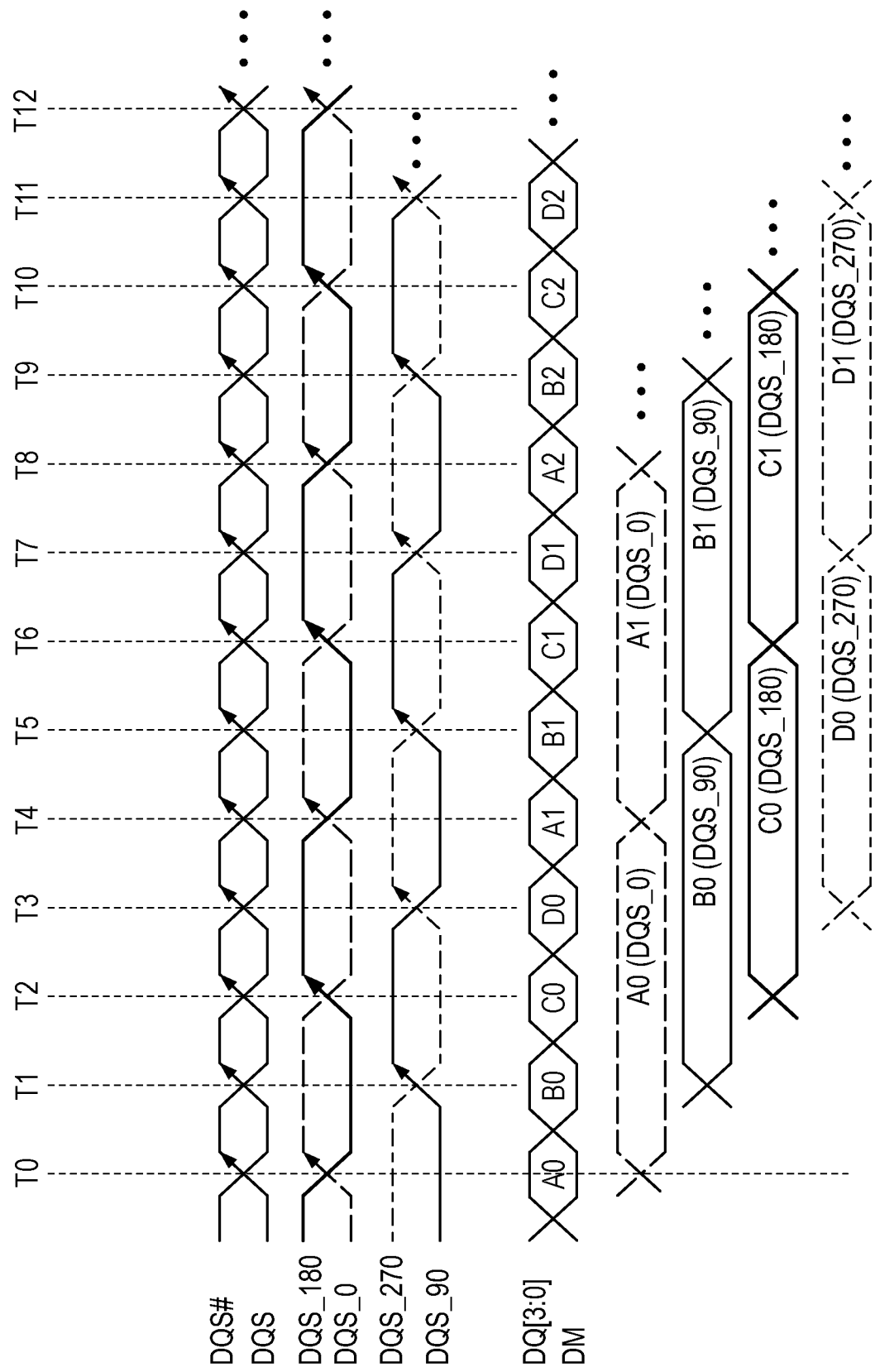
FIG. 3 is a timing diagram of a plurality of signals of the loopback circuit in accordance with the embodiment of the present disclosure.

The data input/output circuit 117 includes a loopback mechanism. FIG. 2 is a schematic diagram of a loopback circuit 200 in accordance with an embodiment of the present disclosure. FIG. 3 is a timing diagram of a plurality of signals of the loopback circuit 200 in accordance with the embodiment of the present disclosure.

In some embodiments, the loopback circuit 200 may include an equalizer 202, such as a decision feedback equalization circuit. The equalizer 202 may receive a data input signal, such as data signals DQ[3:0] and a data mask signal DM, stabilize the data input signal and provide a stabilized data input signal.

The loopback circuit 200 includes circuits 201a-201e for data signals DQ[3:0] and a data mask signal DM. For example, the loopback circuit 200 of FIG. 2 includes the circuit 201a that includes an equalizer 202, a divider 204, latches 206a-206d and a phase multiplexer 208 for the data signal DQ0. Although not shown in FIG. 2, the same circuits are provided for the circuits 201b-201d for the data signals DQ1, DQ2, DQ3 and the data mask signal DM in the loopback circuit 200.

The circuit 201a includes a divider circuit 204. The divider circuit 204 may receive a data strobe signal DQS and provide multiphase divided data strobe signals DQS_0, DQS_90, DQS_180 and DQS_270 having clock frequencies less than the data strobe signal DQS. The divided data strobe signal DQS_0, DQS_90, DQS_180 and DQS_270 may be quadrature clocks and have rising edges at consecutive rising and falling edges of the data strobe signal DQS at T0 (rising edge), T1 (falling edge), T2 (rising edge), T3 (falling edge), . . . etc., as shown in FIG. 3. Each of the divided data strobe signal DQS_0, DQS_90, DQS_180 and DQS_270 may have clock frequencies one-half of a frequency of the data strobe signal DQS, and thus may have a clock cycle twice a cycle of the data strobe signal DQS.

The circuit 201a may include latches 206a-206d that receive the stabilized data input signal (e.g., the data signals DQ[3:0] and the data mask signal DM) and latch the stabilized data input signal responsive to respective divided data strobe signals DQS_0, DQS_90, DQS_180 and DQS_270. For example, the latch 206a receives an active divided data strobe signal DQS_0 and latches the stabilized data input signal and provides the latched signals DQA. The latch 206b receives an active divided data strobe signal DQS_90 and latches the stabilized data input signal and provides the latched signals DQB. The latch 206c receives an active divided data strobe signal DQS_180 and latches the stabilized data input signal and provides the latched data signal DQC. The latch 206d receives an active divided data strobe signal DQS_270 and latches the stabilized data input signal and provide the latched data signal DQD.

The circuit 201a may include a phase multiplexer 208. The phase multiplexer 208 may receive the latched data input signals DQA-DQD and the respective divided data strobe signal DQS_0, DQS_90, DQS_180 and DQS_270 and provide a selected pair of data input signal (e.g., _DQ0) and the data input strobe signal (e.g., _DQS) to a DQ multiplexer 210. For example, the pairs DQA and DQS_0, DQB and DQS_90, DQC and DQS_180 or DQD and DQS_270 may be provided to the DQ multiplexer 210 as a selected pair of data input signal (e.g., _DQ0) and the data input strobe signal (e.g., _DQS). Thus, the data input signal, either DQA, DQB, DQC or DQD, depending on a data strobe signal with a phase of interest, either DQS_0, DQS_90, DQS_180 or DQS_270 may be provided to the DQ multiplexer 210.

The DQ multiplexer 210 may receive the selected pairs of data input signals (e.g., _DQ0, _DQ1, _DQ2, _DQ3) and the data mask (_DM) and the respective divided data strobe signals (e.g., _DQS) for each data input signal of the data input signals (e.g., _DQ0, _DQ1, _DQ2, _DQ3), and may selectively provide one of the data input signals (e.g., _DQ0, _DQ1, _DQ2, _DQ3) corresponding to one bit of four bits data as a loopback data signal LBDQ. The DQ multiplexer 210 may also provide the divided data strobe signal (e.g., _DQS) that has been selected in the phase multiplexer 208 as a loopback data strobe signal LBDQS.

As described above, the loopback circuit 200 may provide a received data signal and a corresponding data strobe signal back to an external receiver for multiple purposes. For example, the loopback circuit 200 allows a host (memory controller or a test instrument) to monitor data provided to a semiconductor device (e.g., the semiconductor device 10) without providing the data to a memory cell array. Thus, actual memory access becomes optional.

Figure 4:
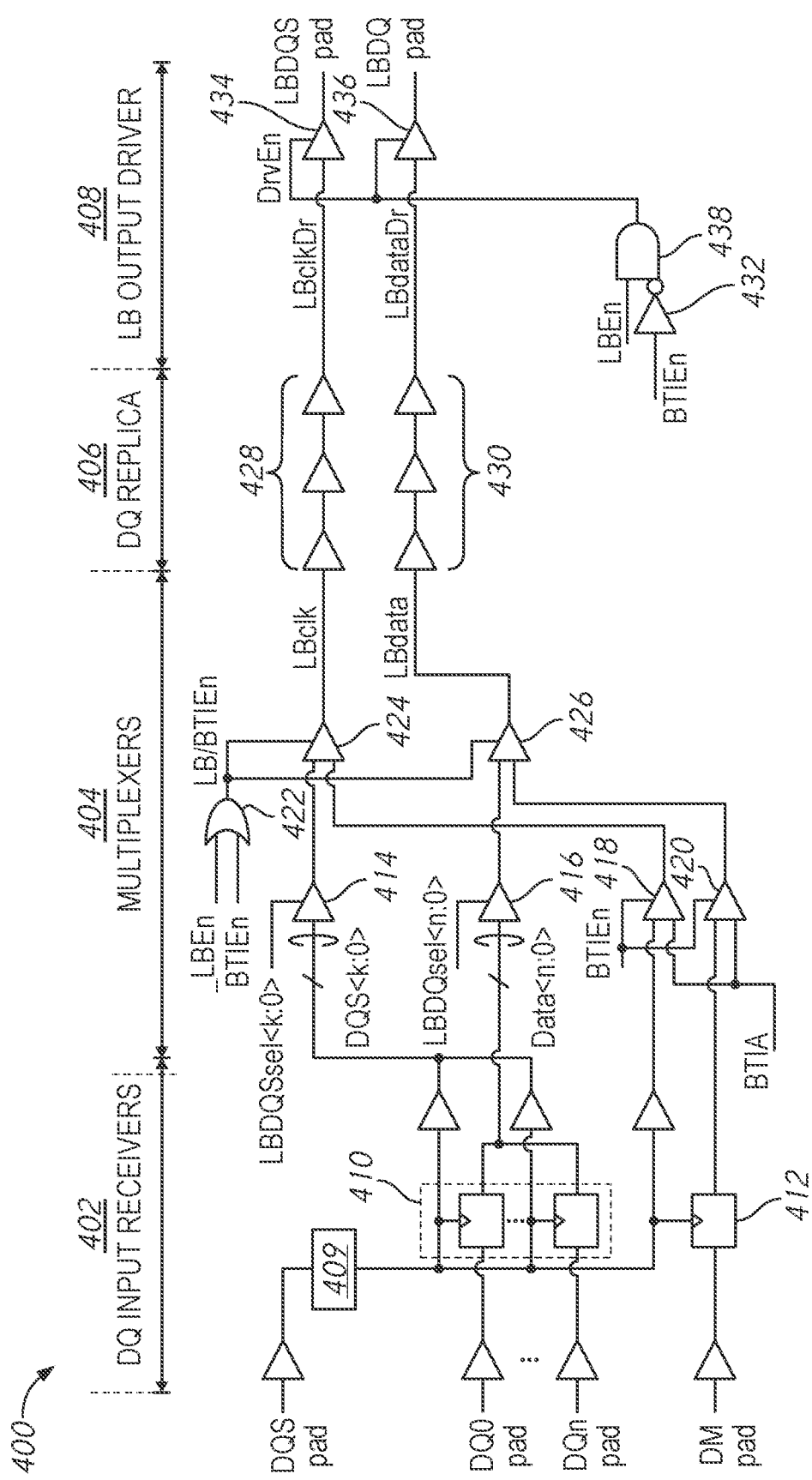
FIG. 4 is a circuit diagram of a loopback circuit in accordance with an embodiment of the present disclosure.

FIG. 4 is a circuit diagram of a loopback circuit 400 in accordance with an embodiment of the present disclosure. In some embodiments, the loopback circuit 400 may include portions of the loopback circuit 200 in FIG. 2. The loopback circuit 400 may include a DQ input receiver 402, multiplexers 404, DQ replica 406 and a loopback output driver 408.

The loopback circuit 400 may receive data signals DQ[n:0], a data mask signal DM and a data strobe signal DQS at DQ pads for DQ0, . . . DQn a DM pad and a DQS pad of the DQ input receiver 402, respectively.

The DQ input receiver 402 may include a data latch circuit 410. In some embodiments, the data latch circuit 410 may include data latches for the data signals DQ0, . . . DQn. In some embodiments, the data signals DQ[n:0] may include DQ[3:0] in FIGS. 2 and 3. In some embodiments, each data latch of the data latches for the data signals DQ0, . . . DQn may be a flip-flop circuit that may latch the data signals DQ0 . . . DQn responsive to the data strobe signal DQS. In some embodiments, each data latch for the data signals DQ0-DQn may include latches 206a-206d. Each latch of the latches 206a-206d may latch a data signal of the data signals DQ0-DQn responsive to each of the divided data strobe signals DQS_0, DQS_90, DQS_180 and DQS_270 as described in FIGS. 2-3.

In some embodiments, the DQ input receiver 402 may include a data mask latch 412. The data mask latch 412 may receive the data mask signal DM, and may latch the data mask signal DM responsive to the data strobe signal DQS.

In some embodiments, the multiplexers 404 may include phase multiplexers 414 and DQ multiplexers 416. In some embodiments, the phase multiplexers 414 may be the phase multiplexers 208 of FIG. 2. The phase multiplexers 414 may receive respective divided data strobe signals DQS<k:0> from a divider 409 that receives the data strobe signal DQS from the DQS pad. In some embodiments, the divided data strobe signals may be the divided data strobe signals DQS_0, DQS_90, DQS_180 and DQS_270 in FIGS. 2-3. The phase multiplexers 414 may provide a selected divided data strobe signal among the divided data strobe signals DQS<k:0> responsive to one activated phase selection signal among respective phase selection signals LBDQSsel<k:0>provided to the phase multiplexers 414.

In some embodiments, the DQ multiplexer 416 may be the DQ multiplexer 210 of FIG. 2. The DQ multiplexers 416 may receive the latched data signals DQ<n:0>. The DQ multiplexers 416 may provide a selected data signal among the data signals DQ<n:0>responsive to one activated data selection signal among respective data selection signals LBDQsel<n:0>provided to the DQ multiplexers 416.

In some embodiments, a BTI alleviation signal may be provided from an oscillator (not shown) outside the loopback circuit 400. The BTI alleviation signal BTIA transitions between two different states, such as a logic high state and a logic low state. A BTI alleviation mode enable signal BTIEn may also be provided to the loopback circuit 400. The BTI alleviation enable signal BTIEn in an active state (e.g., the logic high level in FIG. 5) instructs the loopback circuit 400 that the loopback circuit 400 is in a BTI alleviation mode. In some embodiments, the BTI alleviation mode is performed while a memory cell array, such as the memory cell array 111 in FIG. 1, associated with the loopback circuit 400 may be in a power off state or in a self-refresh mode, and there is no data is transmitted between the memory cell array and an data input/output circuit, such as the data input/output circuit 117 that includes the loopback circuit 400. When the loopback circuit 400 is not in the BTI activation mode, the BTI alleviation enable signal BTIEn in an inactive state (e.g., a logic low level in FIG. 5).

The multiplexers 404 may include a DQS_BTI selector 418 and a DM_BTI selector 420. The DQS_BTI selector 418 and the DM_BTI selector 420 may selectively provide the BTI alleviation signal BTIA when a BTI alleviation enable signal BTIEn is in an active state (e.g., a logic high level in FIG. 5). In some embodiments, the DQS_BTI selector 418 may receive the data strobe signal DQS and the BTI alleviation signal BTIA at input nodes and the BTI alleviation enable signal BTIEn at a control node. Responsive to the BTI alleviation enable signal BTIEn in the inactive state (e.g., a logic low level in FIG. 5), the DQS_BTI selector 418 may provide the data strobe signal DQS. Responsive to the BTI alleviation enable signal BTIEn in the active state (e.g., the logic high level in FIG. 5), the DQS_BTI selector 418 may provide the BTI alleviation signal BTIA. In some embodiments, the DM_BTI selector 420 may receive the latched data mask signal DM and the BTI alleviation signal BTIA at input nodes and the BTI alleviation enable signal BTIEn at a control node. Responsive to the BTI alleviation enable signal BTIEn in the inactive state (e.g., a logic low level in FIG. 5), the DM_BTI selector 420 may provide the latched data mask signal DM. Responsive to the BTI alleviation enable signal BTIEn in the active state (e.g., the logic high level in FIG. 5), the DM_BTI selector 420 may provide the BTI alleviation signal BTIA.

The multiplexers 404 may include a loopback path enable circuit 422. In some embodiments, the loopback path enable circuit 422 may receive an inverse loopback enable signal _LBEn and the BTI alleviation enable signal BTIEn at input nodes. The inverse loopback enable signal _LBEn in an inactive state (e.g., a loopback enable signal LBEn in the logic high level in FIG. 5) instructs the loopback circuit 400 to perform a loopback operation. The inverse loopback enable signal _LBEn in an active state (e.g., the loopback enable signal LBEn in the logic low level in FIG. 5) instructs the loopback circuit 400 to stop the loopback operation. In some embodiments, the loopback path enable circuit 422 may include a logic OR gate. The loopback path enable circuit 422 may provide a control signal LB/BTIEn in an active state when the BTI alleviation enable signal BTIEn is in an active state or the inverse loopback enable signal _LBEn is in an active state instructing the loopback circuit 400 to stop the loopback operation.

The multiplexers 404 may include a loopback clock selector 424 and a loopback data selector 426. The loopback clock selector 424 and the loopback data selector 426 may selectively provide either a target pair of the selected divided data strobe signal and the selected data signal or the BTI alleviation signal BTIA. In some embodiments, the loopback clock selector 424 may receive the selected divided data strobe signal and a signal from the DQS_BTI selector 418 at input nodes and the control signal LB/BTIEn at a control node. Responsive to the control signal LB/BTIEn in the inactive state indicative of the loopback mode, the loopback clock selector 424 may provide the selected divided data strobe signal from the phase multiplexer 414. Responsive to the control signal LB/BTIEn in the active state, the loopback clock selector 424 may provide either the data strobe signal DQS or the BTI alleviation signal BTIA from the DQS_BTI selector 418 as a loopback clock signal LBclk. In some embodiments, the loopback data selector 426 may receive the selected data signal and a signal from the DM_BTI selector 420 at input nodes and the control signal LB/BTIEn at a control node. Responsive to the control signal LB/BTIEn in the inactive state indicative of the loopback mode, the loopback data selector 426 may provide the selected data signal from the DQ multiplexer 416. Responsive to the control signal LB/BTIEn in the active state, the loopback data selector 426 may provide either the latched data mask signal DM or the BTI alleviation signal BTIA from the DM_BTI selector 420 as a loopback data signal LBdata.

The DQ replica 406 may include a pair of series of buffers 428 and 430 to match a clock propagation delay in a clock path and a data propagation delay in a data path for an actual data write operation, respectively. The series of buffers 428 may receive the loopback clock signal LBclk and provide a loopback clock signal for driver LBclkDr that is delayed by the clock propagation delay from the loopback clock signal LBclk. The series of buffers 430 may receive the loopback data signal LBdata and provide a loopback data signal for driver LBdataDr that is delayed by the data propagation delay from the loopback data signal LBdata.

The loopback output driver 408 may include an LB output controller 438, a loopback clock driver 434 and a loopback data driver 436. The loopback output driver 408 may include a BTIA disable circuit 432 that may provide an inverted signal of the BTI alleviation enable signal BTIEn. The LB output controller 438 may receive the loopback enable signal LBEn and the inverted BTI alleviation enable signal _BTIEn. If the BTI alleviation enable signal BTIEn is in an active state, the LB output controller 438 may provide an inactive driver enable signal DrvEn to disable the loopback clock driver 434 and the loopback data driver 436 in order to stop providing the BTI alleviation signal BTIA to a LBDQS pad and a LBDQ pad respectively coupled to the loopback clock driver 434 and the loopback data driver 436. If the BTI alleviation enable signal BTIEn is in an inactive state and if the loopback enable signal LBEn is in an active state, the LB output controller 438 may provide an active driver enable signal DrvEn to activate the loopback clock driver 434 and the loopback data driver 436. Thus, the loopback clock driver 434 and the loopback data driver 436 may provide the selected divided data strobe signal and the selected data signal received as the loopback clock signal for driver LBclkDr and the loopback data signal for driver LBdataDr to the LBDQS pad and the LBDQ pad, respectively.

Figure 5:
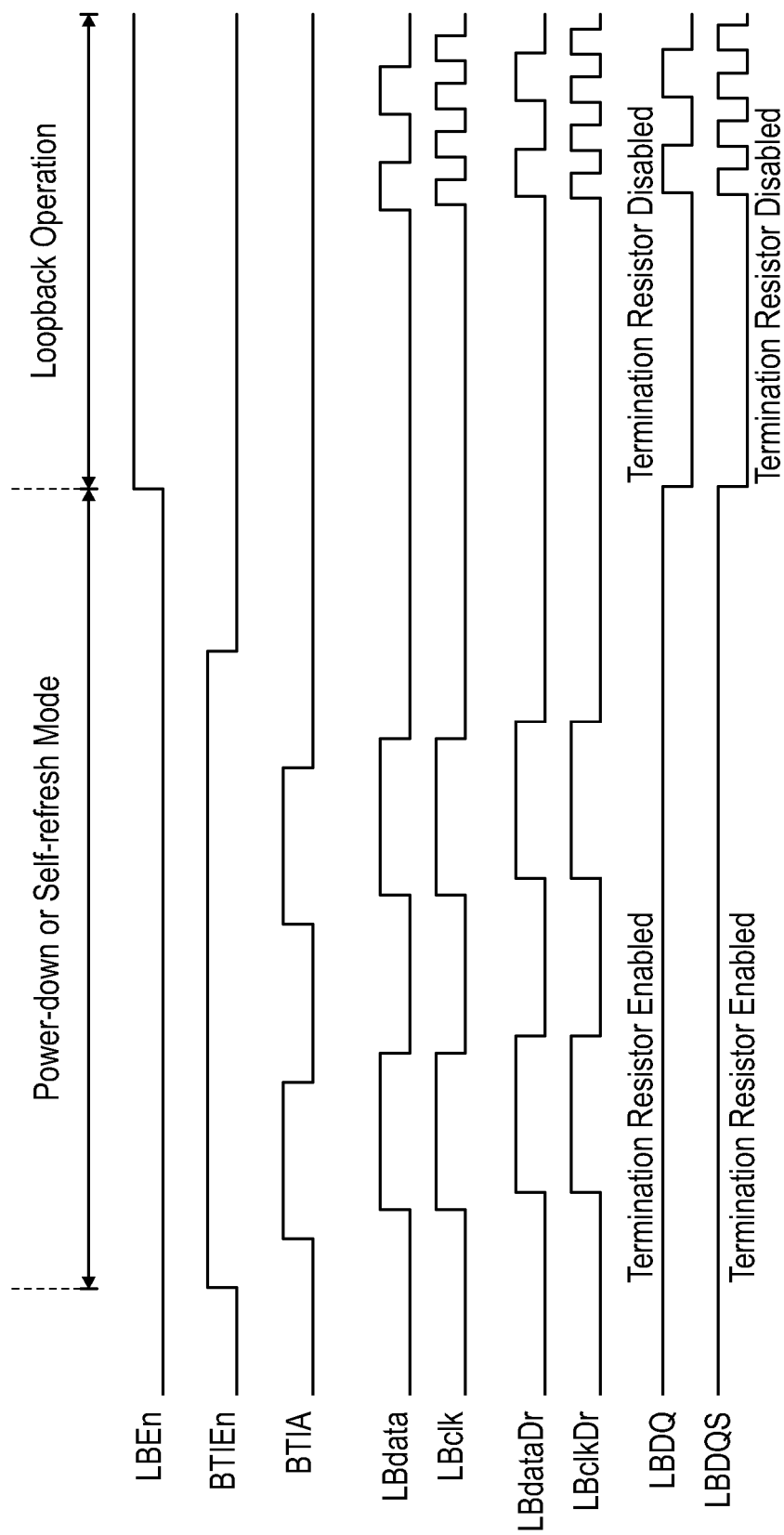
FIG. 5 is a timing diagram of a plurality of signals of the loopback circuit in accordance with an embodiment of the present disclosure.

FIG. 5 is a timing diagram of a plurality of signals of the loopback circuit 400 in accordance with an embodiment of the present disclosure. While a memory cell array (not shown) associated with a data input/output circuit (not shown) that includes the loopback circuit 400 may be either in a power off state or in a self-refresh mode, there is no data transmitted between the memory cell array and the data input/output circuit. In some embodiments, the memory cell array and the data input/output circuit may be the memory cell array 111 and the data input/output circuit 117 in FIG. 1. During the power off state or the self-refresh mode, the loopback enable signal LBEn, an inverse signal of the inverted loopback signal _LBEn in FIG. 4, is in an inactive state at a logic low level. During the inactive state of the loopback enable signal LBEn, the BTI alleviation enable signal BTIEn may be activated and the BTI alleviation signal BTIA that has a longer cycle than a clock cycle of the data may be provided to the loopback circuit 400, and the BTI alleviation signal BTIA may be provided as the loopback clock signal LBclk and the loopback data signal LBdata with a propagation delay, and may be further provided as the loopback clock signal for driver LBclkDr and the loopback data signal for driver LBdataDr with a greater delay to compensate the propagation delays of the actual clock and data paths. Because the BTIA disable circuit 432 provides the inverted signal of the BTI alleviation enable signal BTIEn and the LB output controller 438 provides the inactive driver enable signal DrvEn to disable the loopback clock driver 434 and the loopback data driver 436, the BTI alleviation signal BTIA may not be driven. In some embodiments, the termination resistors, such as a termination resistor coupled to the calibration terminal ZQ 127 shown in FIG. 1, may be enabled responsive to the inactive state of the loopback enable signal LBEn to pull up the LBDQS pad and the LBDQ pad.

Once the loopback circuit 400 starts executing a loopback operation responsive to an active state (e.g., a logic high level) of the loopback enable signal LBEn, the termination resistors may be disabled. The BTI alleviation enable signal BTIEn may become inactive, and the BTI alleviation signal BTIA may not be provided. Responsive to the loopback enable signal LBEn in an active state, the selected divided data strobe signal and the selected data may be provided as the loopback clock data LBclk and the loopback data signal LBdata with a propagation delay, and may be further provided as the loopback clock signal for driver LBclkDr and the loopback data signal for driver LBdataDr with a greater delay to compensate the propagation delays of the actual clock and data paths. Because the BTIA disable circuit 432 provides the inverted signal of the BTI alleviation enable signal BTIEn at a logic high level and the LB output controller 438 provides the active driver enable signal DrvEn to enable the loopback clock driver 434 and the loopback data driver 436, the loopback clock driver 434 and loopback data driver 436 may provide the loopback clock signal for driver LBclkDr and the loopback data signal for driver LBdataDr to the LBDQS pad and the LBDQ pad, respectively.

Thus, transistors in clock and data paths for transmitting the selected divided data strobe signal and selected data signal may be provided with the BTI alleviation signal BTIA, thus the transistors may be protected from the BTI stress.

Figure 6:
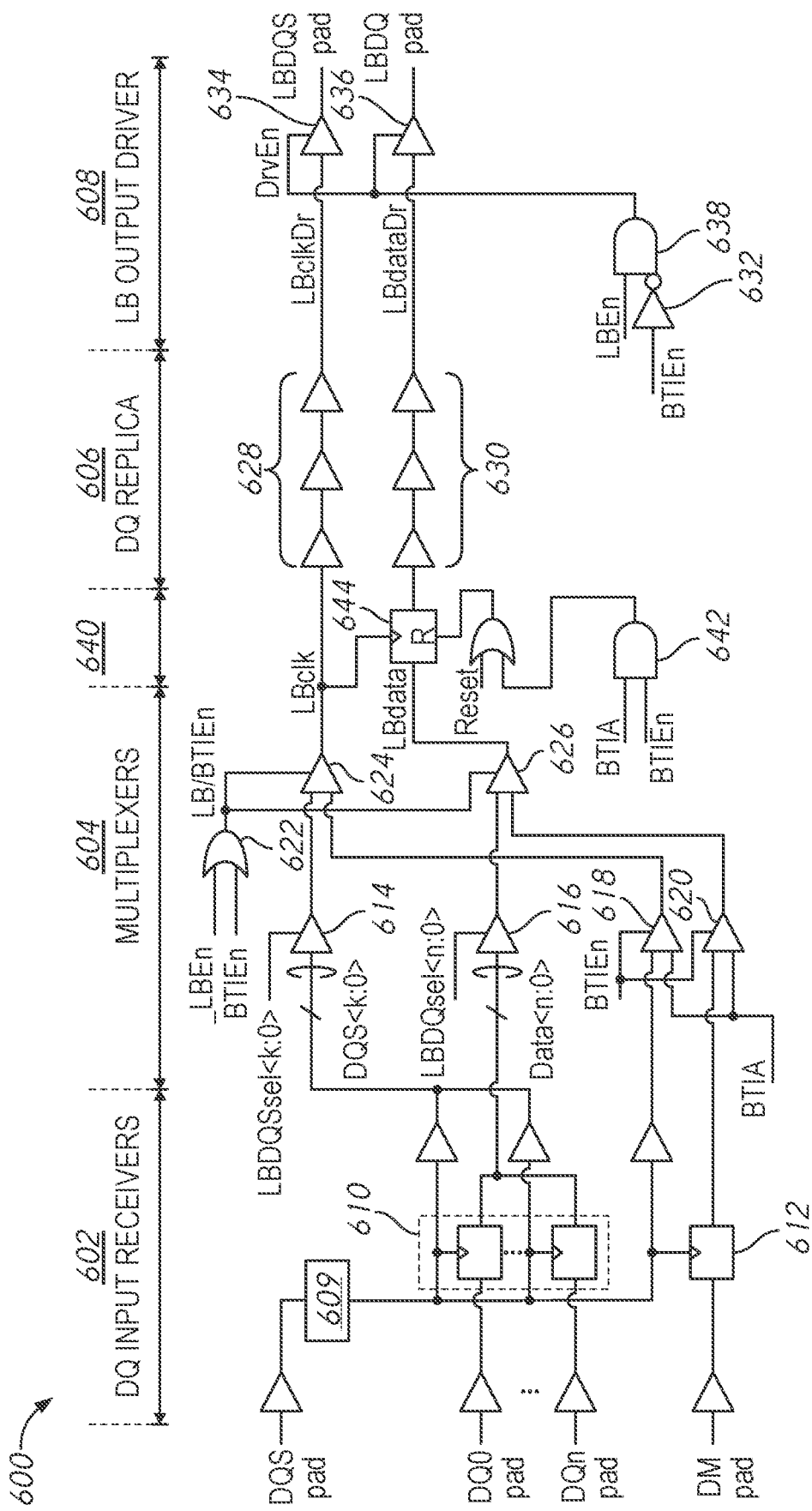
FIG. 6 is a circuit diagram of a loopback circuit in accordance with an embodiment of the present disclosure.

FIG. 6 is a circuit diagram of a loopback circuit 600 in accordance with an embodiment of the present disclosure. The loopback circuit 600 includes a DQ input receiver 602, multiplexers 604, a DQ replica 606 and a loopback output driver 608. In some embodiments, the DQ input receiver 602, the multiplexers 604, the DQ replica 606 and the loopback output driver 608 may be configured similarly to the DQ input receiver 402, the multiplexers 404, the DQ replica 406 and the loopback output driver 408 earlier described with referring FIG. 4, thus the description of circuit structures of the DQ input receiver 602, the multiplexers 604, the DQ replica 606 and the loopback output driver 608 is not repeated.

The loopback circuit 600 may further include a replica alleviation circuit 640. The replica alleviation circuit 640 may include a BTIA replica control circuit 642 that may provide the BTI alleviation signal BTIA when the BTI alleviation enable signal BTIEn is at a logic high level. When the BTI alleviation signal BTIA is a logic high level or a reset signal is at a logic high level, a latch 644 may be reset. Otherwise, the latch 644 may latch the loopback data signal LBdata with a loopback clock signal LBclk and provide the latched signal to the series of buffers 630. When the BTI alleviation enable signal BTIEn is at a logic high level, the BTI alleviation signal BTIA as the loopback data signal LBdata from the loopback data selector 626 may be latched responsive to the BTI alleviation signal BTIA as the loopback clock signal LBclk from the loopback clock selector 624. Thus, the transistors in the DQ replica 606 may be further protected from the BTI stress.

Countermeasure for degradation of transistors in a loopback circuit due to BTI stress were described. Transistors in a loopback circuit may be provided with a BTI alleviation signal that may take different logic levels as time elapses during an inactive state of signal transmissions, such as a semiconductor memory device is either in an off-state or in a self-refresh mode. Because of reduced BTI stress during the inactive state, gate delay times may be kept in the semiconductors, and setup time for high-speed operations in the loopback circuit may be maintained.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:
a plurality of input receivers; and
a loopback circuit coupled to the plurality of input receivers comprising:
a signal multiplexer configured to provide an input signal received at one input receiver of the plurality of input receivers as a selected signal; and
a selector coupled to the signal multiplexer, configured to provide a loopback signal based on the selected signal and an alleviation signal, the alleviation signal transitions between two different states, periodically.

2. The apparatus of claim 1, wherein the loopback signal is the selected signal during a loopback mode, and
wherein the loopback signal is the alleviation signal during an alleviation mode.

3. The apparatus of claim 1, further comprising an alleviation signal selector configured to selectively provide the alleviation signal to the selector when an alleviation enable signal instructs the loopback circuit that the loopback circuit is in an alleviation mode.

4. An apparatus comprising:
a plurality of input receivers;
a loopback circuit coupled to the plurality of input receivers comprising:
a signal multiplexer configured to provide an input signal received at one input receiver of the plurality of input receivers as a selected signal; and
a selector coupled to the signal multiplexer, configured to provide a loopback signal based on the selected signal and an alleviation signal, the alleviation signal transitions between two different states, periodically; and
a loopback path enable circuit configured to receive:
a loopback enable signal that instructs the loopback circuit to perform a loopback operation; and
an alleviation enable signal instructs the loopback circuit that the loopback circuit is in an alleviation mode,
wherein the loopback path enable circuit is further configured to provide the selector with a control signal in an active state responsive to the loopback enable signal and the alleviation enable signal.

5. The apparatus of claim 4, further comprising a memory cell array associated with a data input/output circuit including the loopback circuit,
wherein the memory cell array is either in a power off state or in a self-refresh mode during the alleviation mode.

6. The apparatus of claim 5, further comprising:
a replica coupled to the selector, the replica comprising a delay equivalent to a propagation delay of a signal path that is configured to transmit the input signal from the one input receiver of the plurality of input receivers to the memory cell array, and the replica configured to receive the loopback signal and provide the loopback signal delayed by the delay equivalent to the propagation delay; and
a loopback output driver coupled to the replica, the loopback output driver configured to receive the loopback signal with the delay and further configured to provide the loopback signal with the delay to a loopback pad.

7. The apparatus of claim 6, wherein the loopback output driver comprises;
an alleviation signal disable circuit configured to provide an inverse signal of an alleviation enable signal that instructs that the loopback circuit is not in the alleviation mode;
a loopback output controller configured to provide a driver enable signal responsive to the inverse signal and the loopback enable signal; and
a driver configured to receive the loopback signal with the delay and further configured to provide the loopback signal with the delay to the loopback pad responsive to the driver enable signal.

8. The apparatus of claim 6, further comprising a latch configured to receive the loopback signal from the selector, and further configured to provide the loopback signal to the replica responsive to a clock signal based on the alleviation signal.

9. The apparatus of claim 8, further comprising an alleviation signal replica control circuit configured to provide the alleviation signal while the alleviation enable signal instructs that the loopback circuit is in the alleviation mode.

10. An apparatus comprising:
a plurality of input receivers configured to receive a data strobe signal and a plurality of data signals;
a loopback circuit coupled to the plurality of input receivers, comprising:
a divider circuit configured to provide a plurality of divided data strobe signals based on the data strobe signal;
a phase multiplexer configured to provide one divided data strobe signal among the plurality of divided data strobe signals;
a phase selector coupled to the phase multiplexer and configured to provide a loopback clock signal based on the one divided data strobe signal and an alleviation signal, the alleviation signal transitions between two different states;
a data multiplexer configured to receive the plurality of data signals, and further configured to provide one data signal among the plurality of data signals; and
a data selector coupled to the data multiplexer, configured to provide a loopback data signal based on the one data signal and the alleviation signal.

11. The apparatus of claim 10, wherein the loopback clock signal is the one divided data strobe signal during a loopback mode,
wherein the loopback data signal is the one data signal during the loopback mode, and
wherein the loopback clock signal and the loopback data signal are the alleviation signals during an alleviation mode.

12. The apparatus of claim 10 further comprising:
a phase alleviation selector configured to selectively provide the alleviation signal to the phase selector when an alleviation enable signal instructs the loopback circuit that the loopback circuit is in an alleviation mode and further configured to provide the data strobe signal when the alleviation enable signal instructs the loopback circuit that the loopback circuit is not in the alleviation mode; and
a data alleviation selector configured to selectively provide the alleviation signal to the data selector when the alleviation enable signal instructs the loopback circuit that the loopback circuit is in the alleviation mode and further configured to provide a data mask signal when the alleviation enable signal instructs the loopback circuit that the loopback circuit is not in the alleviation mode.

13. The apparatus of claim 10, further comprising a loopback path enable circuit configured to receive:
a loopback enable signal that instructs the loopback circuit to perform a loopback operation; and
an alleviation enable signal instructs the loopback circuit that the loopback circuit is in an alleviation mode,
wherein the loopback path enable circuit is further configured to provide the phase selector and the data selector with a control signal in an active state responsive to the loopback enable signal and the alleviation enable signal.

14. The apparatus of claim 13, further comprising a memory cell array associated with a data input/output circuit including the loopback circuit,
wherein the memory cell array is either in a power off state or in a self-refresh mode during the alleviation mode.

15. The apparatus of claim 14, further comprising:
a clock replica comprising a clock delay, coupled to the phase selector, the clock replica configured to receive the loopback clock signal and provide the loopback clock signal delayed by the clock delay;
a data replica comprising a data delay, coupled to the data selector, the data replica configured to receive the loopback data signal and provide the loopback data signal delayed by the data delay; and
a loopback output driver comprising:
a loopback clock output driver coupled to the clock replica, the loopback clock output driver configured to receive the delayed loopback clock signal and further configured to provide the delayed loopback clock signal to a loopback clock pad; and
a loopback data output driver coupled to the data replica, the loopback data output driver configured to receive the delayed loopback data signal and further configured to provide the delayed loopback data signal to a loopback data pad,
wherein the clock delay is equivalent to a propagation delay of a clock path that is configured to transmit the data strobe signal from one of the plurality of input receivers to the memory cell array, and
wherein the data delay is equivalent to a propagation delay of a data path that is configured to transmit the data signal from one of the plurality of input receivers to the memory cell array.

16. The apparatus of claim 15, wherein the loopback output driver further comprises:
an alleviation signal canceller configured to provide an inverse signal of an alleviation enable signal that instructs that the loopback circuit is not in the alleviation mode, and
a loopback output controller configured to provide a driver enable signal responsive to the inverse signal and the loopback enable signal,
wherein the loopback clock output driver and the loopback data output driver are configured to provide the delayed loopback clock signal and the delayed loopback data signal responsive to the driver enable signal.

17. The apparatus of claim 15, further comprising a latch configured to receive the loopback data signal from the data selector, and further configured to provide the loopback data signal to the data replica responsive to the loopback clock signal.

18. The apparatus of claim 17, further comprising an alleviation signal replica control circuit configured to provide the alleviation signal to a reset node of the latch while the alleviation enable signal instructs that the loopback circuit is in the alleviation mode.

19. An apparatus comprising:
a plurality of input receivers configured to receive a data strobe signal and a plurality of data signals; and
a loopback circuit coupled to the plurality of input receivers, comprising:
a phase multiplexer configured to receive a plurality of divided data strobe signals, and further configured to provide one divided data strobe signal among the plurality of divided data strobe signals;
a phase selector configured to provide the one divided data strobe signal during a loopback operation;
a data multiplexer configured to receive the plurality of data signals, and further configured to provide one data signal among the plurality of data signals; and
a data selector configured to receive the one data signal, and further configured to provide the one data signal during the loopback operation,
wherein the phase selector and the data selector are configured to provide an alleviation signal that transitions between two different states during an alleviation mode.

20. The apparatus of claim 19, further comprising:
a clock replica coupled to the phase selector, configured to receive the one divided data strobe signal and further configured to provide the one divided data strobe signal delayed by a clock propagation delay of a clock path that is configured to transmit the data strobe signal from one of the plurality of input receivers to a memory cell array during the loopback operation;
a clock output driver configured to provide the delayed one divided data strobe signal to a loopback clock pad;
a data replica coupled to the data selector, configured to receive the one data signal and further configured to provide the one data signal delayed by a data propagation delay of a data path that is configured to transmit the data signal from one of the plurality of input receivers to the memory cell array during the loopback operation; and
a data output driver configured to provide the delayed one data signal to a loopback data pad,
wherein the clock output driver and the data output driver are configured to stop providing the alleviation signal to the loopback clock pad and the loopback data pad during the alleviation mode.

21. The apparatus of claim 19, further comprising:
an alleviation signal replica control circuit configured to provide the alleviation signal to the data replica while the alleviation enable signal instructs that the loopback circuit is in the alleviation mode.

* * * * *